United States Patent
Li et al.

(10) Patent No.: US 11,888,145 B2
(45) Date of Patent: Jan. 30, 2024

(54) TERNARY SINGLE CRYSTAL POSITIVE ELECTRODE MATERIAL, PREPARATION METHOD THEREFOR AND USE THEREOF

(71) Applicants: GUANGDONG BRUNP RECYCLING TECHNOLOGY CO., LTD., Foshan (CN); HUNAN BRUNP RECYCLING TECHNOLOGY CO., LTD., Changsha (CN); HUNAN BRUNP VEHICLES RECYCLING CO., LTD., Changsha (CN)

(72) Inventors: Feilong Li, Foshan (CN); Dingshan Ruan, Foshan (CN); Shuai Han, Foshan (CN); Wenzhu Ma, Foshan (CN); Quele Wang, Foshan (CN); Qingcheng Fang, Foshan (CN); Changdong Li, Foshan (CN)

(73) Assignees: GUANGDONG BRUNP RECYCLING TECHNOLOGY CO., LTD., Foshan (CN); HUNAN BRUNP RECYCLING TECHNOLOGY CO., LTD., Changsha (CN); HUNAN BRUNP VEHICLES RECYCLING CO., LTD., Changsha (CN)

(*) Notice: Subject to any disclaimer, the term of this patent is extended or adjusted under 35 U.S.C. 154(b) by 0 days.

(21) Appl. No.: 18/245,886

(22) PCT Filed: Aug. 3, 2021

(86) PCT No.: PCT/CN2021/110332
§ 371 (c)(1),
(2) Date: Mar. 17, 2023

(87) PCT Pub. No.: WO2022/062677
PCT Pub. Date: Mar. 31, 2022

(65) Prior Publication Data
US 2023/0299264 A1   Sep. 21, 2023

(30) Foreign Application Priority Data
Sep. 24, 2020 (CN) .......................... 202011013341.4

(51) Int. Cl.
H01M 4/04 (2006.01)
H01M 4/505 (2010.01)
H01M 4/525 (2010.01)
H01M 10/0525 (2010.01)
H01M 4/02 (2006.01)

(52) U.S. Cl.
CPC ......... *H01M 4/0471* (2013.01); *H01M 4/505* (2013.01); *H01M 4/525* (2013.01); *H01M 10/0525* (2013.01); *H01M 2004/021* (2013.01); *H01M 2004/028* (2013.01)

(58) Field of Classification Search
None
See application file for complete search history.

(56) References Cited

U.S. PATENT DOCUMENTS

| | | | |
|---|---|---|---|
| 2011/0291044 A1 | 12/2011 | Wang et al. | |
| 2020/0343550 A1* | 10/2020 | Cho | H01M 4/525 |
| 2021/0126242 A1* | 4/2021 | Du | H01M 4/364 |
| 2022/0059837 A1* | 2/2022 | Shen | H01M 4/62 |

FOREIGN PATENT DOCUMENTS

| | | |
|---|---|---|
| CN | 101621125 A | 1/2010 |
| CN | 107394160 A | 11/2017 |
| CN | 108428871 A | 8/2018 |
| CN | 110436531 A | 11/2019 |
| CN | 110534733 A | 12/2019 |
| CN | 110790323 A | 2/2020 |
| CN | 111092202 A | 5/2020 |
| CN | 111422921 A | 7/2020 |
| CN | 112301428 A | 2/2021 |
| CN | 112301428 B | 1/2022 |
| JP | 2005-29418 A | 2/2005 |
| WO | 2022062677 A1 | 3/2022 |

OTHER PUBLICATIONS

First Office Action in Chinese Application No. 202011013341.4 dated May 18, 2021.
First Search in Chinese Application No. 202011013341.4 dated May 8, 2021.
Supplementary Search in Chinese Application No. 202011013341.4 dated Oct. 21, 2021.
International Search Report and Written Opinion in PCT/CN2021/110332 dated Nov. 1, 2021.
Notification to Grant Patent Right for Invention in Chinese Application No. 202011013341.4 dated Nov. 2, 2021.

* cited by examiner

*Primary Examiner* — Carlos Barcena
(74) *Attorney, Agent, or Firm* — Buchalter; Jason W. Croft

(57) ABSTRACT

Disclosed are a ternary single crystal positive electrode material, a preparation method therefor and use thereof. The preparation method comprises the following steps: mixing a ternary polycrystalline micropowder, raising a temperature, carrying out a primary sintering, and lowering the temperature to obtain an intermediate; subjecting the intermediate to jet pulverization to obtain a single crystal material, washing the single crystal material with water, and centrifugally drying the single crystal material to obtain a material with a residual alkali content of less than 1500 ppm; and adding a coating agent to the material, raising a temperature, carrying out a secondary sintering, and lowering the temperature to obtain the ternary single crystal positive electrode material. In the present disclosure, by using a jet pulverization device to open a polycrystalline material to form small single crystal particles, the electrochemical performance and the energy density of the material is improved.

8 Claims, 7 Drawing Sheets

TERNARY SINGLE CRYSTAL POSITIVE ELECTRODE MATERIAL, PREPARATION METHOD THEREFOR AND USE THEREOF

CROSS-REFERENCE TO RELATED APPLICATION

The present application is a national phase entry under 35 USC § 371 of International Application PCT/CN2021/110332, filed Aug. 3, 2021, which claims the benefit of and priority to Chinese Patent Application No. 202011013341.4, filed Sep. 24, 2020, the entire disclosures of which are incorporated herein by reference.

TECHNICAL FIELD

The present disclosure belongs to the field of lithium ion battery positive electrode materials, and in particular relates to a ternary single crystal positive electrode material, a preparation method therefor and use thereof.

BACKGROUND

With the increasing requirements for the cruising range of electric vehicles, ternary positive electrode materials with a higher Ni content (such as NCM811) have become the focus of research, and this ternary positive electrode material with a Ni content greater than 0.6 is generally referred to as "high-nickel ternary positive electrode material". This material has a relatively high content of Ni, and high energy density, so it can meet short-term market demand to a certain extent, and alleviate the range anxiety of electric vehicles; furthermore, since the content of cobalt is relatively low, it has a better cost advantage. During the production of ternary positive electrode materials, it is inevitable to produce some by-products, for example, 1-10% of micropowder is produced during crushing production by means of mechanical grinding. During industrialized mass production, an output of 1-10% of micropowder is considerable. Moreover, the specifications of the micropowder itself are much smaller than those of normal materials, the collection speed during production is slow, and the packaging is untimely, resulting in a particularly high content of residual alkalies in the product, particularly a particularly high content of $Li_2CO_3$. The high content of $Li_2CO_3$ can cause the water content to exceed standards, leading to gas production during battery cycles, which affects the safety performance, and if the battery is scrapped directly, greater economic damage and environmental pollution will be caused. In order to response to the call of cost reduction, efficiency improvement, energy conservation and emission reduction in China, and promote clean production, develop circular economy and accelerate energy-saving technological transformation, it is imperative to develop recycling processes for by-products. However, each batch of micropowder has different physical and chemical properties, in particular, the residual alkali content and the button battery capacity, due to different processes or process treatments. Therefore, it is necessary to develop a recycling process suitable for most micropowders.

With the continuous development of the new energy source industry, the requirements for power batteries are getting higher and higher, and consequently, the requirements for the nickel content in ternary materials increases. However, the resulting problems concerning the stability of a positive electrode material, the matching of an electrolyte solution, battery failures caused by high current charging-induced temperature rise, etc. are also attracting more and more attention. Therefore, single crystal materials come into being, which not only enhance the stability of the positive electrode materials, but can also raise the voltage of the entire system to a new level, and proposes a solution to the demand for higher energy density.

Studies have shown that with the increase in the number of cycles of a polycrystalline ternary positive electrode material, duce to the different crystal plane orientations and glide planes of primary particles in secondary spheres, and the anisotropy of the expansion and contraction of the lattice between crystal grains, in the cycle later period of the polycrystalline ternary positive electrode material, secondary particle breakage may occur and microcracks may occur among the primary particles, which will increase the contact area between the material and the electrolyte solution, intensify the side reaction with the electrolyte solution, and cause serious capacity attenuation. However, single crystal materials can avoid this situation and maintain the integrity of the structure during repeated cycles, thereby improving the cycle stability. Single crystal materials improve the cycle stability due to the combination of their lower specific surface area and excellent structural stability, and can still maintain the original morphology of particles after a long cycle.

At present, by means of coating and sintering, the surface properties of the ternary material can be improved, the surface transfer resistance thereof can be reduced, the ion conductivity thereof can be improved, the water absorption performance thereof can also be reduced, and the side reaction between the material and the electrolyte solution is reduced. Therefore, there is an urgent need to develop a ternary single crystal positive electrode material with few side reactions and a small resistivity and a preparation method therefor.

SUMMARY

The objective of the present disclosure is to provide a ternary single crystal positive electrode material and a preparation method therefor. In this method, a ternary polycrystalline micropowder is used as the raw material, which improves the utilization of the material and increases product benefits. The prepared ternary single crystal positive electrode material has advantages of not only reducing the diffusion length of lithium ions, providing channels for the rapid transport of lithium ions, but also improving the capacity retention rate of the material under a high charge cut-off voltage. In addition, by means of coating and sintering, the surface properties of the ternary material can be improved, the surface transfer resistance thereof can be reduced, the ion conductivity thereof can be improved, the water absorption performance thereof can also be reduced, and the side reaction between the material and an electrolyte solution can be reduced.

In order to achieve the above-mentioned objective, the present disclosure uses the following technical solution:

A method for preparing a ternary single crystal positive electrode material is provided, which comprises the following steps:

(1) mixing a ternary polycrystalline micropowder, raising a temperature, carrying out a primary sintering, and lowering the temperature to obtain an intermediate;

(2) subjecting the intermediate to jet pulverization to obtain a single crystal material, washing the single crystal material with water, and centrifugally drying the single crystal material to obtain a material with a residual alkali content of less than 1500 ppm; and (3) adding a coating agent to the material, raising a temperature, carrying out a secondary sintering, and lowering the temperature to obtain the ternary single crystal positive electrode material, wherein the coating agent is at least one of an oxide, hydroxide and salt of a metal, or an oxide and fluoride of a non-metal, or a corresponding acid and salt of the non-metal; the metal is at least one of Al, Ce, Y, Zn, Si, Cr, Nb, Mg, La, Sr, Zr, Sn, Na, Ca, Sb, V, and W; and the non-metal is at least one of B, P, F, C, and S, with aluminum hydroxide being excluded.

A single crystal nickel cobalt manganese ternary positive electrode material $LiNi_xCo_yMn_zO_2$ has advantages of not only reducing the diffusion length of lithium ions, providing channels for the rapid transport of lithium ions, but also improving the capacity retention rate of the material under a high charge cut-off voltage, and effectively improving the cycle, inflation, capacity recovery and other problems of the material at high temperatures, thereby effectively improving the electrochemical properties of the material. The single crystal nickel cobalt manganese ternary positive electrode material has a high mechanical strength, a larger compaction density, which makes the material not fragile during electrode compaction, and also a smaller specific surface area, which can greatly reduce the contact area between the material and the electrolyte solution, thereby effectively inhibiting the occurrence of side reactions during cycles, enhancing the structural stability of the material, and significantly improving the cycle life of a battery. Therefore, the preparation of a ternary polycrystalline micropowder into a ternary single crystal positive electrode material by means of a new process can not only recycle the by-product, increase the utilization of the material, and increase product benefits, but can also improve the cycle performance, safety performance, and electrochemical performance of the product to produce a single crystal product with a higher energy density. By using a jet pulverization device to open the polycrystalline material to form small single crystal particles, the electrochemical performance of the material is improved; secondly, by means of a process of washing with water, centrifugal drying to wash away excess residual alkali, the processing performance and safety performance of the material can be improved; and finally by means of coating and sintering, the surface properties of the ternary material can be improved, the surface transfer resistance thereof can be reduced, the ion conductivity thereof can be improved, the water absorption performance thereof can also be reduced, and the side reaction between the material and an electrolyte solution is reduced.

Preferably, in step (1), the ternary polycrystalline micropowder is an unqualified product produced by means of mechanical grinding of the ternary polycrystalline material during crushing, which is a by-product produced during crushing of the ternary polycrystalline material. Preferably, the size of the ternary polycrystalline powder is 2.0-4.0 μm.

Preferably, in step (1), a chemical formula of the ternary polycrystalline micropowder is $LiNi_xCo_yMn_zO_2$, with $0.5 \leq x \leq 0.95$, $0 \leq y \leq 0.4$, $0.05 \leq z \leq 0.4$, and $x+y+z=1$.

Preferably, in step (1), an equipment used for the mixing is one of a coulter mixer, a screw mixer, a non-gravity mixer, a V-type mixer, a double spiral cone mixer, a three-dimensional mixer, a powder mixer, a high-speed mixer, or a ball mill By means of mixing, the residual LiOH, $Li_2CO_3$ and doped additives in the micropowder become more uniform; moreover, the uniformity of the particle size of the micropowder is relatively poor, and the mixing can make the sintering raw material uniform, which is beneficial for the primary particles of the micropowder to grow into full, round and uniform-size small particles during high temperature sintering.

Preferably, the mixing in step (1) lasts for 0.5-4 h.

Preferably, in step (1), a temperature of the primary sintering is 600-900° C., and the primary sintering lasts for 4-30 h.

Preferably, in step (1), a rate for raising the temperature is 3-5° C./min; and a rate for lowering the temperature is 2-5° C./min.

Preferably, in step (1), an atmosphere in which the primary sintering is carried out is one of air or oxygen.

Preferably, in step (1), a gas introduction rate during the primary sintering is 5-15 $m^3$/h.

Preferably, in step (2), an equipment used for the crushing process is a fluidized bed jet mill; and the fluidized bed jet mill comprises an induced draft fan, a grinding chamber, a classification wheel, and a cyclone separator.

More preferably, a classification frequency of the jet pulverization is 60-150 Hz, an induced air pressure is −15 KPa to 0 KPa, a gas pressure is 0.20-0.50 KPa, and a grinding base material is 2-10 kg.

Preferably, in step (2), requirements for the particle size of the single crystal material are: a $D_v50$ of 2.0-4.0 μm and a $D_v99$ of less than 10 μm.

Preferably, in step (2), a mass ratio of the water to the single crystal material (water-to-material ratio) during the washing process is (0.5-3.0): 1; a speed of the washing with water is 150-450 rpm; and the washing with water lasts for 1-30 min.

Preferably, in step (2), a rotation speed of the centrifugation is 30-80 Hz; and the centrifugation lasts for 30-60 min.

Preferably, in step (2), the drying is conducted at a temperature of 60-200° C.; and the drying lasts for 4-10 h.

Preferably, in step (3), a temperature of the secondary sintering is 200-400° C., and the secondary sintering lasts for 4-20 h.

Preferably, in step (3), an atmosphere in which the secondary sintering is carried out is one of air or oxygen.

Preferably, in step (3), a gas introduction rate during the secondary sintering is 5-15 $m^3$/h.

Preferably, in step (3), a volume concentration of the oxygen atmosphere is 50-99.9%.

Preferably, in step (3), a rate for raising the temperature is 3-5° C./min; a rate for lowering the temperature is 2-5° C./min.

A ternary single crystal positive electrode material is provided, a chemical formula of which is $LiNi_xCo_yMn_zO_2@M$, wherein M is at least one of Al, Ce, Y, Zn, Si, W, B, Cr, Nb, Mg, V, P, La, Sr, Zr, Sn, F, C, Na, Ca, S, and Sb; and $0.5 \leq x \leq 0.95$, $0 \leq y \leq 0.4$, $0.05 \leq z \leq 0.4$, and $x+y+z=1$.

Preferably, the chemical formula of the ternary single crystal positive electrode material is $LiNi_{0.8}Co_{0.1}BO_2$, $LiNi_{0.6}Co_{0.2}Mn_{0.2}BO_2$, or $LiNi_{0.8}Co_{0.1}Mn_{0.1}SnO_2$.

Preferably, a resistivity of the ternary single crystal positive electrode material is 450-650 Ω·cm, a first discharge specific capacity is 200-206 mAh/g, a capacity retention rate after 50 cycles is greater than 96%, and a compaction density is 3.3-3.5 g/$cm^3$. The specific capacity is measured at a voltage of 4.25 V and a current of 0.1 C.

The present disclosure further provides a lithium ion battery, comprising the above-mentioned ternary single crystal positive electrode material.

Advantages of the Disclosure (1) In the present disclosure, by using a jet pulverization device to open the polycrystalline material to form small single crystal particles, the electrochemical performance of the material is improved, and the energy density of the material is improved; by means of a process of washing with water, centrifugal drying to wash away excess residual alkali, the problem of gas production during the battery cycle can be effectively solved; and during the homogenization and coating process, a "jelly" is formed, thereby improving the processing performance and safety performance of the material.

(2) By preparing the ternary polycrystalline micropowder into a ternary single crystal positive electrode material by means of the preparation method of the present disclosure, the utilization of the material is improved and the product benefits are improved.

(3) The single crystal nickel cobalt manganese ternary positive electrode material $LiNi_xCo_yMn_zO_2@M$ of the present disclosure has advantages of not only reducing the diffusion length of lithium ions, providing channels for the rapid transport of lithium ions, but also improving the capacity retention rate of the material under a high charge cut-off voltage. In addition, by means of coating and sintering, the surface properties of the ternary material can be improved, the surface transfer resistance thereof can be reduced, the ion conductivity thereof can be improved, the water absorption performance thereof can also be reduced, and the side reaction between the material and an electrolyte solution can be reduced.

DETAILED DESCRIPTION

Figure 1:
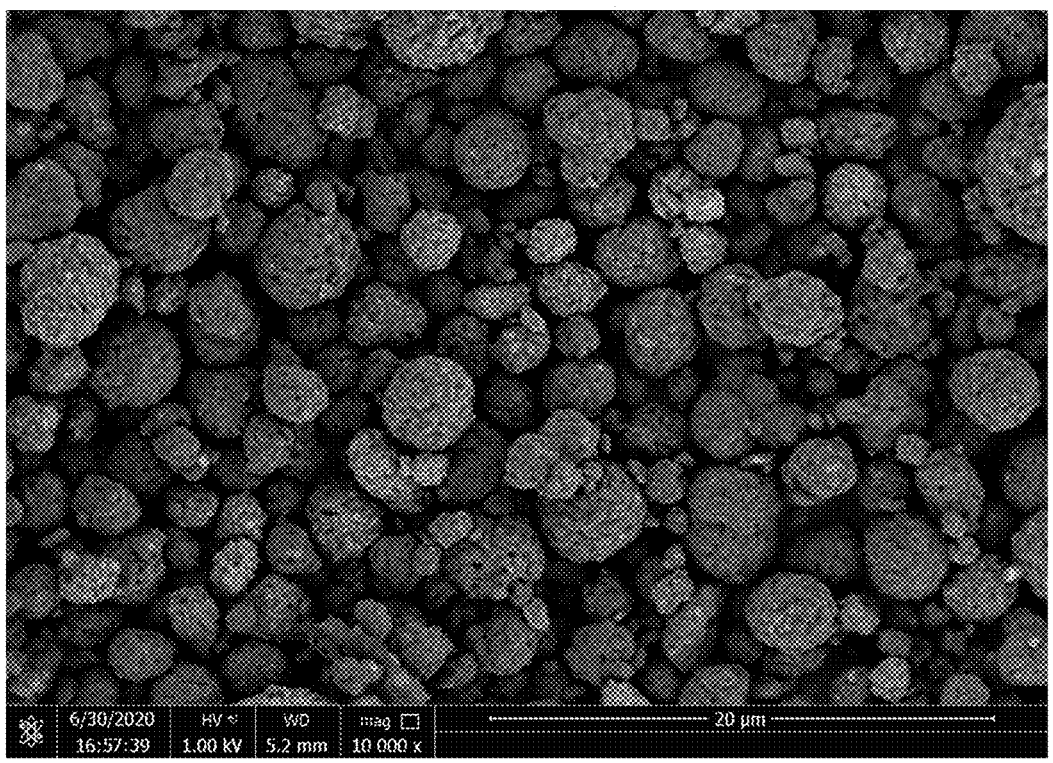
FIG. 1 is an SEM image of a ternary polycrystalline micropowder raw material.

In order to have an in-depth understanding of the present disclosure, preferred experimental schemes of the present disclosure are described in conjunction with examples to further illustrate the characteristics and advantages of the present disclosure. Any alterations or changes that do not deviate from the gist of the present disclosure can be understood by a person skilled in the art. The scope of protection of the present disclosure is determined by the scope of the claims.

If no specific conditions are indicated in the examples of the present disclosure, conventional conditions or the conditions suggested by the manufacturer shall be followed. The raw materials, reagents etc., which are used without indicating the manufacturers, are all conventional products that are commercially available.

Example 1

A ternary single crystal positive electrode material was provided, the chemical formula of which was $LiNi_{0.8}Co_{0.1}Mn_{0.1}BO_2$.

A method for preparing a ternary single crystal positive electrode material was provided, which comprised the following steps:

(1) mixing a ternary polycrystalline micropowder by means of coulter mixing for 1 h to obtain a micropowder raw material; putting the micropowder raw material into a box-type furnace, raising the temperature to 820° C. at a temperature rise rate of 3° C./min for primary sintering, maintaining the temperature for 12 h, lowering the temperature to 500° C. at a temperature fall rate of 2° C./min, and naturally cooling the same to room temperature to obtain an intermediate; wherein in the box-type furnace, an oxygen pressure was 0.2 MPa and a volume concentration of oxygen atmosphere was 50-99.9%;

(2) crushing the intermediate by means of a fluidized bed jet mill to obtain a single crystal material with a particle size distribution of D50=2.6-3.4 μm and D99<10.0 μm; washing the single crystal material with water, and centrifugally drying the single crystal material, wherein the mass ratio of pure water to the material was 2.0:1 and the washing time was 20 min; and then vacuum drying the material, which has been washed with water, at 130° C. to obtain a material with a residual alkali content of less than 1500 ppm; and (3) dry coating the material, which has been washed with water, with $H_3BO_3$ as an additive (with a B content of 1500 ppm), raising the temperature to 300° C. at a temperature rise rate of 3° C./min for coating sintering, continuing to raise the temperature to 340° C. at a temperature rise rate of 1° C./min, maintaining the temperature for 10 h, and naturally cooling the same to room temperature to obtain the ternary single crystal positive electrode material $LiNi_{0.8}Co_{0.1}Mn_{0.1}BO_2$; wherein, during coating sintering, an oxygen pressure was 0.2 MPa and a volume concentration of oxygen atmosphere was 50-99.9%.

The ternary single crystal positive electrode material prepared in Example 1, the conductive agent SP, and the binder PVDF were mixed at a ratio of 18:1:1 (with a total mass of 20 g), and then added to 20 g of an NMP organic solvent solution to obtain a mixed solution; the mixed solution was stirred to obtain a slurry; the slurry was evenly smeared on an 8 μm aluminum foil with a thickness of 200 μm, and dried in a vacuum drying oven at 120° C. for 4 h; the dried pole piece was then compacted on a 30T roller press and finally cut into a round positive electrode piece with a diameter of 14 mm, wherein the mass of the active substance in the round piece was about 14.85 g; the cut positive electrode piece, an electrolyte solution and a separator were assembled into a button battery; and the button battery was left to stand and then tested for the electrochemical performance, wherein the first discharge specific capacity tested at a current of 0.1 C was 201.1 mAh/g, the first charge-discharge efficiency was 91.9%, under the current condition of 0.1 C, the 50th cycle specific capacity was maintained at 195.3 mAh/g, and the 50th cycle capacity retention rate was 97.11%.

Example 2

A ternary single crystal positive electrode material was provided, the chemical formula of which was $LiNi_{0.8}Co_{0.1}Mn_{0.1}BO_2$.

A method for preparing a ternary single crystal positive electrode material was provided, which comprised the following steps:

(1) mixing a ternary polycrystalline micropowder by means of coulter mixing for 1 h to obtain a micropowder raw material; putting the micropowder raw material into a box-type furnace, raising the temperature to 820° C. at a temperature rise rate of 3° C./min for primary sintering, maintaining the temperature for 12 h, lowering the temperature to 500° C. at a temperature fall rate of 2° C./min, and naturally cooling the same to room temperature to obtain an intermediate; wherein in box-type furnace, an air pressure was 0.2 MPa;

(2) crushing the intermediate by means of a fluidized bed jet mill to obtain a single crystal material with a particle size distribution of D50=2.6-3.4 μm and D99<10.0 μm; washing the single crystal material with water, and centrifugally drying the single crystal material, wherein the mass ratio of pure water to the material was 2.0:1 and the washing time was 20 min; and then vacuum drying the material, which has been washed with water, at 130° C. to obtain a material with a residual alkali content of less than 1500 ppm; and (3) dry coating the material, which has been washed with water, with $H_3BO_3$ as an additive (with a B content of 1500 ppm), raising the temperature to 300° C. at a temperature rise rate of 3° C./min for coating sintering, continuing to raise the temperature to 340° C. at a temperature rise rate of 1° C./min, maintaining the temperature for 10 h, and naturally cooling the same to room temperature to obtain the ternary single crystal positive electrode material $LiNi_{0.8}Co_{0.1}Mn_{0.1}BO_2$; wherein, during coating sintering, an air pressure was 0.2 MPa.

The positive electrode material prepared in Example 2, the conductive agent SP, and the binder PVDF were mixed at a ratio of 18:1:1 (with a total mass of 20 g), and then added to 20 g of an NMP organic solvent solution to obtain a mixed solution; the mixed solution was stirred to obtain a slurry; the slurry was evenly smeared on an 8 μm aluminum foil with a thickness of 200 μm, and dried in a vacuum drying oven at 120° C. for 4 h; the dried pole piece was then compacted on a 30T roller press and finally cut into a round positive electrode piece with a diameter of 14 mm, wherein the mass of the active substance in the round piece was about 14.85 g; the cut positive electrode piece, an electrolyte solution and a separator were assembled into a button battery, and the button battery was left to stand and then tested for the electrochemical performance, wherein the first discharge specific capacity tested at a current of 0.1 C was 200.4 mAh/g, and the first charge-discharge efficiency was 90.8%, and under the current condition of 0.1 C, the 50th cycle specific capacity was maintained at 193.7 mAh/g, and the 50th cycle capacity retention rate was 96.68%.

Comparative Example 1

The steps of Comparative Example 1 were almost the same as those of Example 1, except that step (1) of Comparative Example 1 was changed to the following step (1).

(1) A ternary polycrystalline micropowder was mixed by means of coulter mixing for 1 h to obtain a micropowder raw material; the micro powder raw material was put into a box-type furnace; under the condition of an oxygen pressure of 0.2 MPa and a volume concentration of oxygen atmosphere of 50-99.9%, primary sintering was carried out; then the temperature was raised to 820° C. at a temperature rise rate of 3° C./min, maintained for 3 h, and lowered to 500° C. at a temperature fall rate of 2° C./min; the same continued to be naturally cooled to room temperature to obtain an intermediate; and the intermediate was further subjected to jet pulverization, sieving, washing with water, centrifugal drying, and coating sintering to obtain a ternary single crystal positive electrode material. The morphology of the obtained ternary single crystal positive electrode material was shown in FIG. 5.

Comparative Example 2

The steps of Comparative Example 2 were almost the same as those of Example 1, except that the conditions of step (2) in Comparative Example 2 were changed to the following step (2).

(2) The micropowder single crystal material was washed with water and centrifugally dried, wherein the mass ratio of pure water to the micropowder single crystal material was 1.0:1 and the water washing time was 1 min; the material, which has been washed with water, was then vacuum dried at 130° C. to obtain a material with a lower residual alkali content; and the material was further subjected to coating sintering to obtain a ternary single crystal positive electrode material. The morphology of the obtained ternary single crystal positive electrode material was shown in FIG. 6.

Comparative Example 3

The steps of Comparative Example 3 were almost the same as those of Example 1, except that the conditions of step (3) in Comparative Example 3 were changed to the following step (3).

(3) The material, which has been washed with water, was dry coated with $Al(OH)_3$ as an additive (with an Al content of 1500 ppm); under an air pressure of 0.2 MPa, the material was subjected to coating sintering; the temperature was raised to 300° C. at a temperature rise rate of 3° C./min, continued to rise to 340° C. at a temperature rise rate of 1° C./min, and maintained for 10 h; and the material was then naturally cooled to room temperature to obtain a ternary single crystal positive electrode material.

Figure 2:
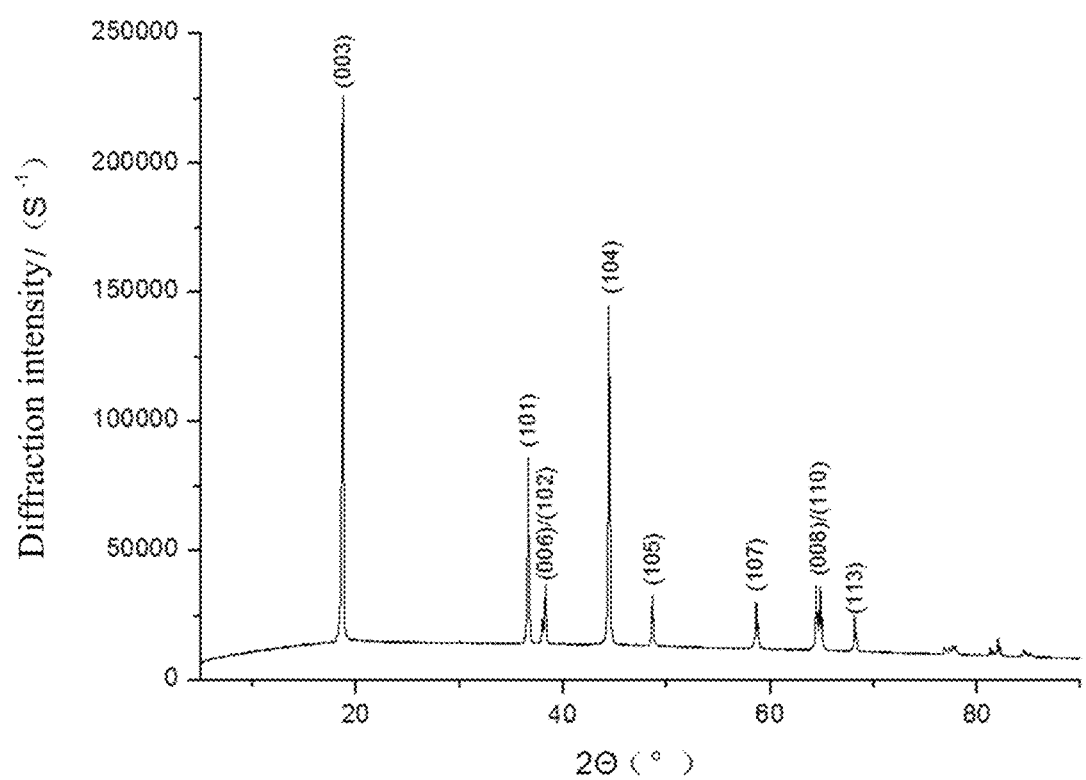
FIG. 2 is an XRD pattern of a ternary single crystal positive electrode material prepared in Example 1.
Figure 3:
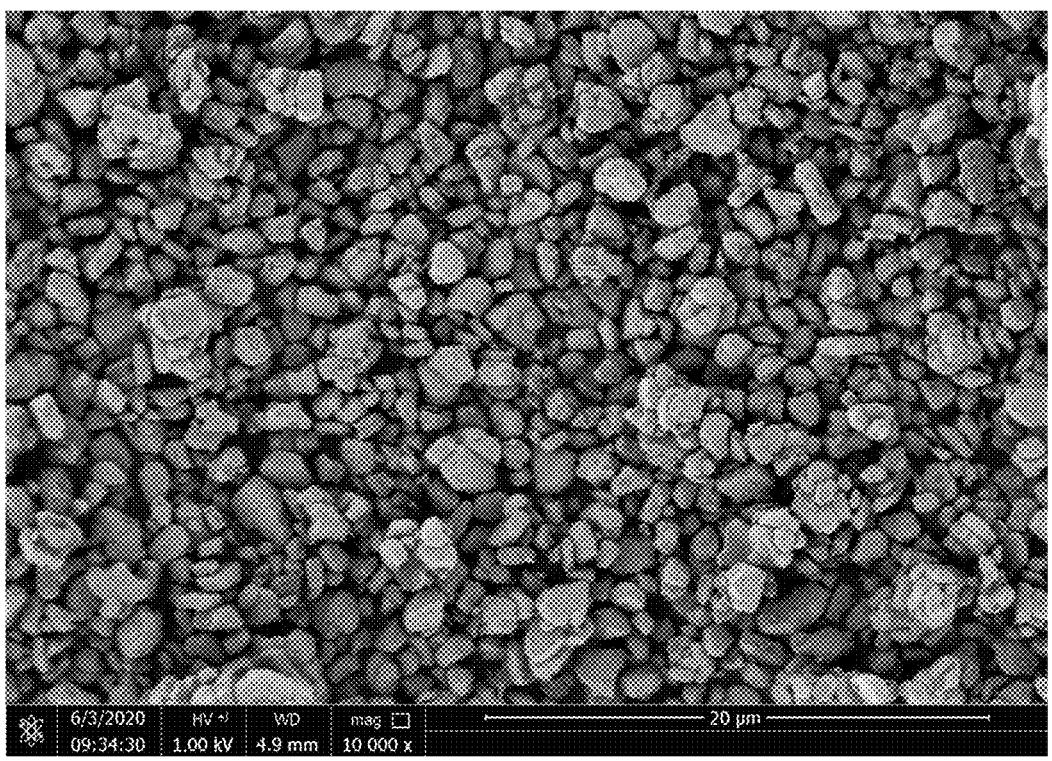
FIG. 3 is an SEM image of the ternary single crystal positive electrode material prepared in Example 1.
Figure 4:
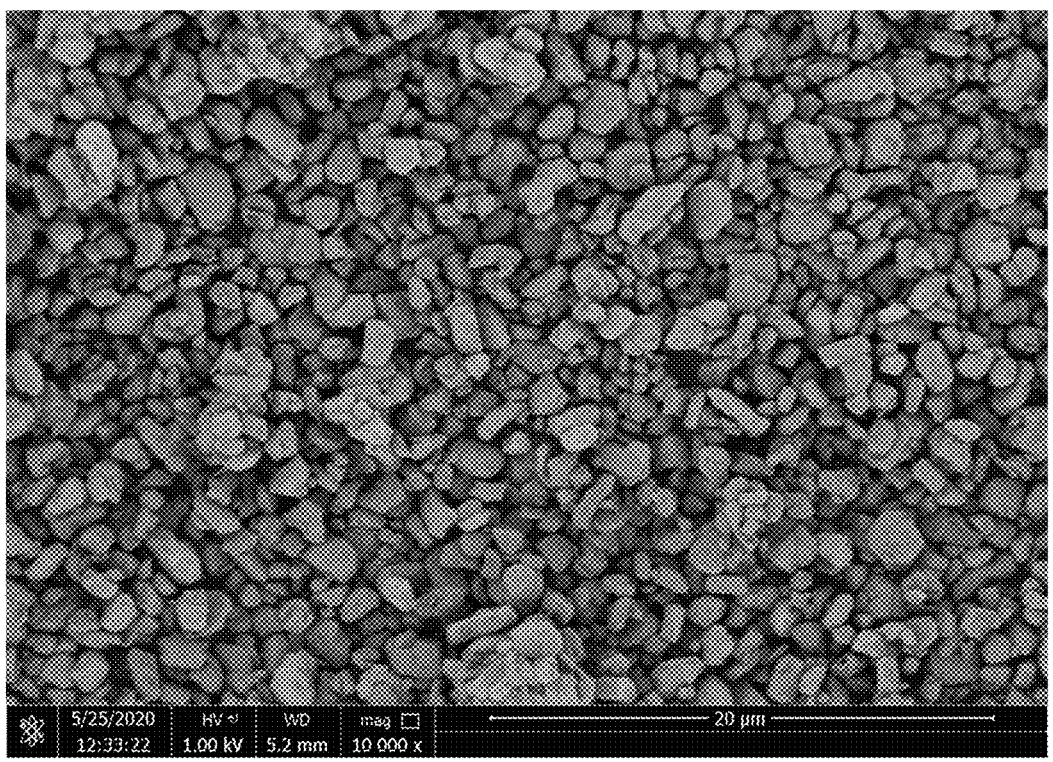
FIG. 4 is an SEM image of a ternary single crystal positive electrode material prepared in Example 2.
Figure 5:
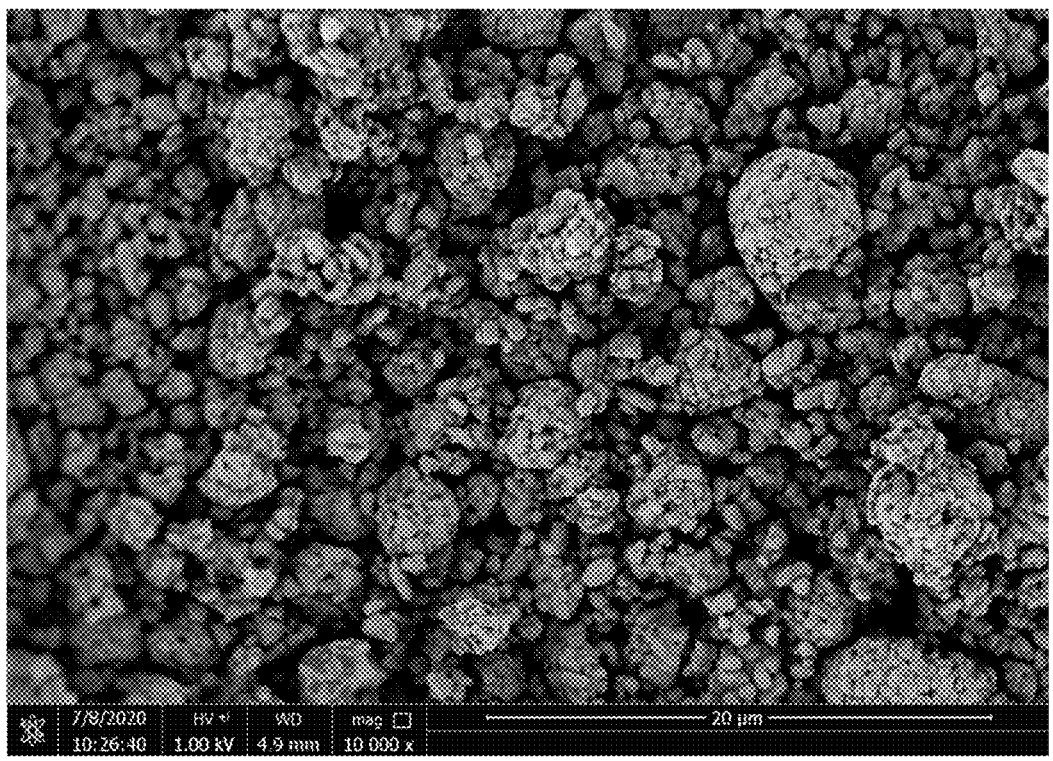
FIG. 5 is an SEM image of the ternary single crystal positive electrode material prepared in Comparative Example 1.
Figure 6:
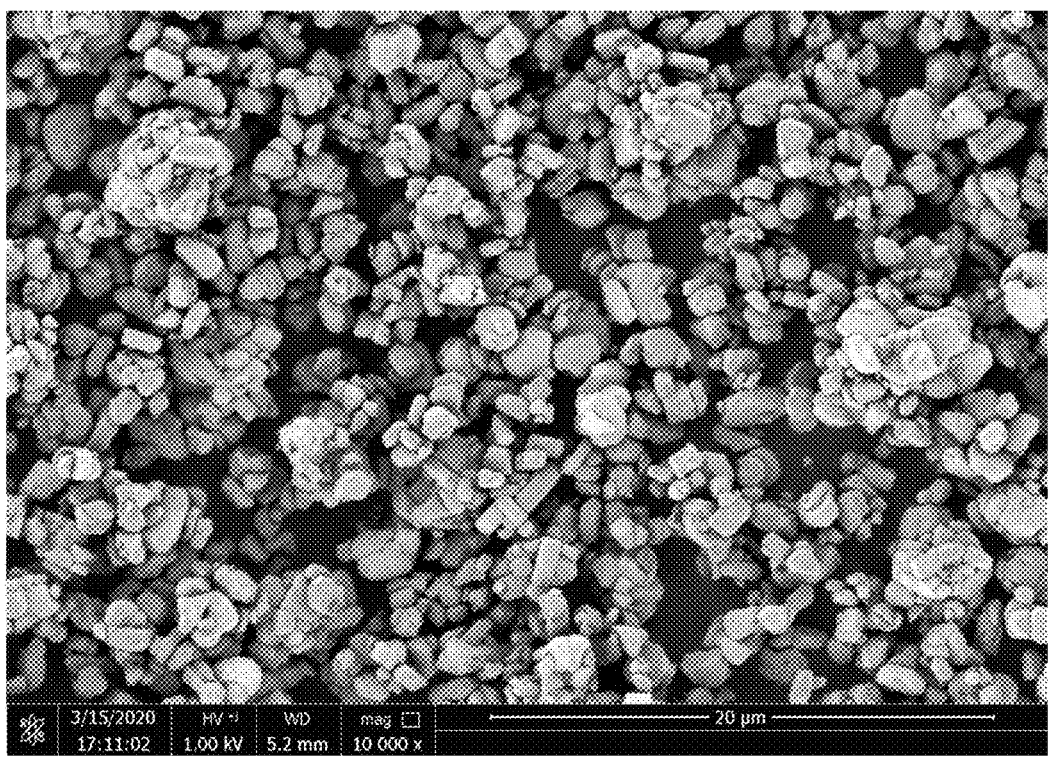
FIG. 6 is an SEM image of the ternary single crystal positive electrode material prepared in Comparative Example 2.
Figure 7:
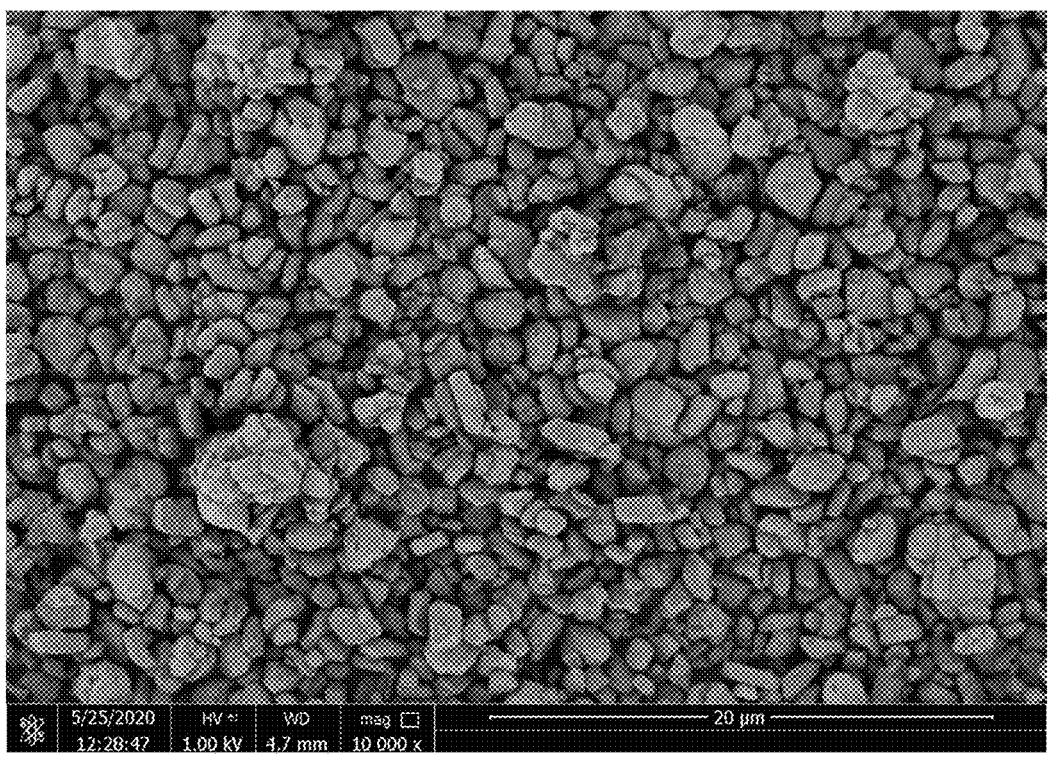
FIG. 7 is an SEM image of a ternary single crystal positive electrode material prepared in Comparative Example 3.

FIG. 1 is an SEM image of a recovered ternary polycrystalline micropowder raw material. It can be seen from the figure that there is a lot of residual lithium on the surface of the polycrystalline micropowder, the micropowder particles are smaller than normal materials, with nonuniform shapes, sizes and distribution, indicating the necessity of pre-mixing and re-sintering. FIG. 2 is an XRD pattern of the ternary single crystal positive electrode material prepared in Example 1, wherein the (006)/(102) and (108)/(110) crystal plane peaks are clearly separated, indicating that the ternary single crystal positive electrode material has a higher degree of crystallinity and a good layered structure; and the (003)/(104) crystal plane peak intensity ratio in the XRD is greater than 1.42, indicating that the ternary single crystal positive electrode material maintains a better crystal structure and low cation mixing, which is beneficial to improve the ion utilization. FIG. 3 is an SEM image of the ternary single crystal positive electrode material prepared in Example 1, which has been sintered in oxygen. It can be seen from the FIG. 3 that the surface of the ternary single crystal positive electrode material is smooth, and most of the particles are between 2.0 μm and 4 μm in size. FIG. 4 is an SEM image of the ternary single crystal positive electrode material prepared in Example 2, which has been sintered in the air, it can be seen that the material has a relative smooth surface, a relative uniform particle size, and less agglomerations. FIG. 5 is a ternary single crystal positive electrode material obtained by means of primary sintering with a short temperature maintaining time, it can be seen that the primary particles are relatively small and have more agglomerations, so that the capacity cannot be exploited. FIG. 6 is a ternary single crystal material prepared with a relatively low water washing strength, wherein the water washing strength is low, some weak agglomerations are not opened, and the surface of the material is relatively uniform and smooth. FIG. 7 is a ternary positive electrode material obtained by means of coating sintering with a different coating additive (Al (OH)$_3$), wherein the surface of the material is relatively smooth and the coating effect is good.

The comparison results of the electrochemical and physical performances of the raw material and the ternary positive electrode materials of Example 1 and 2 and Comparative Example 1-3 are as shown in Table 1:

TABLE 1

| | First discharge specific capacity (mAh/g) (Temperature of 25° C. and current of 0.1 C.) | First charge-discharge efficiency (%) Efficiency = discharge capacity/charge capacity | 50th cycle discharge specific capacity (mAh/g) (Temperature of 25° C. and current of 0.1 C.) | 50th cycle capacity retention rate (%) | Powder resistivity ($\Omega$*cm) |
|---|---|---|---|---|---|
| Raw material | 180.0 | 90.6 | | | 95900 |
| Example 1 | 201.1 | 91.9 | 195.3 | 97.11 | 453 |
| Example 2 | 200.4 | 90.8 | 193.7 | 96.68 | 638 |
| Comparative Example 1 | 189.3 | 87.6 | 161.2 | 85.13 | 1444 |
| Comparative Example 2 | 195.9 | 90.0 | 181.6 | 92.68 | 910 |
| Comparative Example 3 | 192.6 | 89.1 | 167.7 | 87.08 | 6110 |

Table 1 is a comparison of the electrochemical performance and physical performance of the ternary positive electrode materials of Examples 1 and 2 and Comparative Examples 1-3. The data of the raw material shows that due to improper storage of the ternary polycrystalline micropowder, the residual lithium is high, the resistivity of the powder is high, and the corresponding button battery capacity is relatively low. For Example 1, under the conditions of a voltage of 4.25 V and a current of 0.1 C, the first discharge specific capacity is 201.1 mAh/g, and the first charge-discharge efficiency is 91.9%; and after 50 cycles, the discharge specific capacity is 195.3 mAh/g, and the capacity retention rate is 97.11%, which are significantly better than the electrochemical performances of the ternary positive electrode materials of Comparative Examples 1-3, and the powder resistivity thereof is significantly reduced relative to that of the raw material, and also relatively lower relative to those of the comparative examples. For Example 2, under the conditions of a voltage of 4.25 V and a current of 0.1 C, the first discharge specific capacity is 200.4 mAh/g, and the first charge-discharge efficiency is 90.8%; and after 50 cycles, the discharge specific capacity is 193.7 mAh/g, and the capacity retention rate is 96.68%, that is, the performance of Example 2 is slightly poorer than that of Example 1; however, compared to Comparative Examples 1-3, the electrochemical performance of Example 2 is better and the powder resistivity is lower. For Comparative Example 1, due to the short temperature maintaining time, the particles do not grow up, and have many agglomerations, the corresponding button battery capacity is low, the powder resistivity is high, and the capacity retention rate is low. The water washing strength in Comparative Example 2 is weaker than that in Example 1, there are more weak agglomerations, the button battery capacity thereof is relatively lower, and the powder resistivity is slightly higher. In Comparative Example 3, a different coating additive is used, and the obtained single crystal ternary positive electrode material powder has a high resistivity, which affects the electrochemical performance thereof.

Therefore, the preparation of a ternary polycrystalline micropowder into a ternary single crystal positive electrode material by means of the method of the present disclosure can not only recycle the by-product, increase the utilization of the material, and increase product benefits, but can also improve the cycle performance, safety performance, and electrochemical performance of the product to produce a single crystal ternary positive electrode material with a higher energy density.

The ternary single crystal positive electrode material provided by the present disclosure, the preparation method therefor and the use thereof have been described in detail above, and the specific examples are used herein to explain the principles and implementation of the present disclosure. The description of the above examples is only used to help understand the method of the present disclosure and the core ideas thereof, including the best mode, and also enables any person skilled in the art to practice the present disclosure, including manufacturing and using any device or system, and implementing any combined method. It should be noted that a person of ordinary skill in the art would also make various improvements and modifications to the present disclosure without departing from the principle of the present disclosure, and such improvements and modifications also fall within the scope of protection of the claims of the present disclosure. The scope of patent protection of the present disclosure is defined by the claims, and may include other embodiments conceivable to a person skilled in the art. If these other embodiments have structural elements that are not different from the literal expression of the claims, or if they include equivalent structural elements that are not substantially different from the literal expression of the claims, these other embodiments should also be included in the scope of the claims.

The invention claimed is:

1. A method for preparing a ternary single crystal positive electrode material, comprising the following steps:
   (1) mixing a ternary polycrystalline micropowder, raising a temperature, carrying out a primary sintering, and lowering the temperature to obtain an intermediate;
   (2) subjecting the intermediate to jet pulverization to obtain a single crystal material, washing the single crystal material with water, and centrifugally drying the single crystal material to obtain a material with a residual alkali content of less than 1500 ppm; and
   (3) adding a coating agent to the material, raising a temperature, carrying out a secondary sintering, and lowering the temperature to obtain the ternary single crystal positive electrode material; wherein the coating agent is at least one of an oxide, hydroxide and salt of a metal, or an oxide and fluoride of a non-metal, or a corresponding acid and salt of the non-metal; the metal is at least one of Al, Ce, Y, Zn, Si, Cr, Nb, Mg, La, Sr, Zr, Sn, Na, Ca, Sb, V, and W; and the non-metal is at least one of B, P, F, C, and S, with aluminum hydroxide being excluded;
   wherein in step (1), the ternary polycrystalline micropowder is an unqualified product produced by means of mechanical grinding of the ternary polycrystalline material during crushing, which is a by-product produced during crushing of the ternary polycrystalline material; and a chemical formula of the ternary polycrystalline micropowder is $LiNi_xCo_yMn_zO_2$, with $0.5 \leq x \leq 0.95$, $0 \leq y \leq 0.4$, $0.05 \leq z \leq 0.4$, and $x+y+z=1$.

2. The method according to claim 1, wherein in step (1), a temperature of the primary sintering is 600-900° C., and the primary sintering lasts for is 4-30 h.

3. The method according to claim 1, wherein in step (1), an atmosphere in which the primary sintering is carried out is one of air or oxygen; and a gas introduction rate during the primary sintering is 5-15 m³/h.

4. The method according to claim 1, wherein in step (2), requirements for the particle size of the single crystal material are: a $D_v50$ of 2.0-4.0 μm and a $D_v99$ of less than 10 μm.

5. The method according to claim 1, wherein in step (2), a mass ratio of the water to the single crystal material during the washing with water is (0.5-3.0): 1; a speed of the washing with water is 150-450 rpm; and the washing with water lasts for 1-30 mm.

6. The method according to claim 1, wherein in step (3), a temperature of the secondary sintering is 200-400° C., and the secondary sintering lasts for 4-20 h; and an atmosphere in which the secondary sintering is carried out is one of air or oxygen.

7. A ternary single crystal positive electrode material, wherein the ternary single crystal positive electrode material is prepared by the method of claim 1, a chemical formula of the ternary single crystal positive electrode material is $LiNi_xCo_yMn_zO_2@M$, wherein the coating agent is at least one of an oxide and fluoride of a non-metal, or a corresponding acid and salt of the non-metal, wherein M is at least one of Si, B, P, F, C, S; and Sb, with $0.5 \leq x \leq 0.95$, $0 \leq y \leq 0.4$, $0.05 \leq z \leq 0.4$, and $x+y+z=1$; a resistivity of the ternary single crystal positive electrode material is 450-650 Ω·cm, a first discharge specific capacity is 200-206 mAh/g, a capacity retention rate after 50 cycles is greater than 96%, and a compaction density is 3.3-3.5 g/cm³.

8. A lithium ion battery, comprising the ternary single crystal positive electrode material of claim 7.

* * * * *